(12) United States Patent
Jung

(10) Patent No.: US 7,629,238 B2
(45) Date of Patent: Dec. 8, 2009

(54) DEVICE ISOLATION STRUCTURE OF A SEMICONDUCTOR DEVICE AND METHOD OF FORMING THE SAME

(75) Inventor: Myung Jin Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 116 days.

(21) Appl. No.: 11/494,388

(22) Filed: Jul. 26, 2006

(65) Prior Publication Data

US 2007/0023858 A1 Feb. 1, 2007

(30) Foreign Application Priority Data

Jul. 26, 2005 (KR) ................ 10-2005-0067890

(51) Int. Cl.
*H01L 21/425* (2006.01)
(52) U.S. Cl. ............... 438/514; 438/524; 257/E21.546
(58) Field of Classification Search ............... 438/424, 438/524–527, 207, 218, 220, 221, 223, 296, 438/356, 359, 433–434, 510, 514, 518–519; 257/E21.546, E21.55, E21.552
See application file for complete search history.

(56) References Cited

U.S. PATENT DOCUMENTS

| 6,991,956 | B2 | 1/2006 | Ghyselen et al. |
| 7,226,846 | B2* | 6/2007 | Takahashi ................... 438/425 |
| 2004/0209437 | A1 | 10/2004 | Chiu et al. |
| 2005/0191812 | A1* | 9/2005 | Pritchard et al. ............ 438/299 |
| 2005/0191825 | A1 | 9/2005 | Ghyselen et al. |
| 2006/0049399 | A1* | 3/2006 | Lei et al. ...................... 257/40 |
| 2007/0004118 | A1* | 1/2007 | Varghese et al. ............ 438/199 |

FOREIGN PATENT DOCUMENTS

| JP | 6-29313 A | 2/1994 |
| WO | 2004/006311 A2 | 1/2004 |
| WO | 2004/006327 A2 | 1/2004 |

OTHER PUBLICATIONS

Soichiro Tanaka; "Manufacture of LOCOS Offset Drain"; , Patent Abstracts of Japan; Publication No. 06-029313; Publication Date: Feb. 4, 1994; Japan Patent Office; Japan.
Chinese Office Action; Application No. 200610103586.X; Dated: Jun. 27, 2008; The State Intellectual Property Office of the People's Republic of China; China.

* cited by examiner

*Primary Examiner*—Davienne Monbleau
*Assistant Examiner*—Hoa B Trinh
(74) *Attorney, Agent, or Firm*—The Law Offices of Andrew D. Fortney; Andrew D. Fortney; Theresa J. Mahan

(57) ABSTRACT

Disclosed are an isolation structure and a method for forming the same. The present isolation structure includes a substrate having a first semiconductor layer having a first lattice parameter, a second semiconductor layer having a second lattice parameter larger than the first lattice parameter, and a strained semiconductor layer; a well in the substrate; a plurality of isolation layers in the strained semiconductor layer and the second semiconductor layer, defining an active region; and a plurality of punch stop layers under the isolation layers.

20 Claims, 3 Drawing Sheets

DEVICE ISOLATION STRUCTURE OF A SEMICONDUCTOR DEVICE AND METHOD OF FORMING THE SAME

This application claims the benefit of Korean Patent Application No. 10-2005-0067890, filed on Jul. 26, 2005, which is incorporated by reference herein in its entirety.

BACKGROUND OF THE INVENTION

1. Field of the Invention

The present invention relates to a semiconductor device and a manufacturing method thereof. More specifically, the present invention relates to a device isolation structure for electrically isolating circuit elements in a semiconductor device, and a method for forming the same.

2. Description of the Related Art

Unit circuit elements, constituting a semiconductor device (e.g., a transistor, diode, capacitor, resistor, or combination thereof), are designed to be electrically isolated so that they are accessed independently of each other. Trench isolation is the representative isolation structure for electrically isolating unit circuit elements. The trench isolation structure comprises an insulating layer filled in a trench that is formed by partially etching a semiconductor substrate, thus defining a plurality of active regions in the substrate. The trench isolation structure helps to electrically isolate circuit elements formed on each active region.

As integration of semiconductor devices increases, distances between circuit elements become shorter. Therefore, electrical isolation of elements is getting more and more important. Especially, in the case where a strained channel having more increased charge-mobility is formed on a semiconductor substrate for the purpose of improvement of a signal transmission speed and a ratio of current to voltage (i.e., conductivity), there is an increased possibility that charges will leak under an isolation structure and adjacent circuit elements will break down.

FIGS. 1 and 2 are cross-sectional view illustrating a method for forming an isolation structure in a strained semiconductor substrate according to the conventional art.

Referring to FIG. 1, a semiconductor substrate 10 comprises a semiconductor layer 12 thereon having a lattice parameter larger than that of the substrate 10. Then, a strained semiconductor layer 14 is epitaxially grown on the semiconductor layer 12, using an element having a lattice parameter smaller than that of the semiconductor layer 12. In the case where an epitaxial layer consisting of relatively small size of atoms is grown on the semiconductor layer 12 consisting of relatively large size of atoms, the lattice parameter between the small atoms is increased to form a strained structure. In general, the semiconductor layer 12 comprises a germanium epitaxial layer having the lattice parameter (e.g., distance between atoms) larger than that of the silicon substrate 10, and the semiconductor layer 14 comprises a silicon epitaxial layer grown on the germanium layer 12. In such case, the distance between silicon atoms in the semiconductor layer 14 is increased to form the strained silicon layer. Because the lattice parameter of the strained silicon layer is larger than that of the silicon substrate, the strained silicon layer has superior charge mobility and conductivity (e.g., a ratio of current to voltage) to typical bulk silicon.

Referring to FIG. 2, when a semiconductor circuit elements are formed on a substrate including a strained semiconductor layer that has higher charge mobility and conductivity, as described above, trench isolation structures 16 may have a depth sufficient to prevent current leakage and reduction of break-down voltages. However, such deep trench isolation structures may hinder filling the trenches with an insulating material, and thus may have voids therein due to a high aspect ratio of the trench structure. As a result, characteristics and reliability of devices may deteriorate.

SUMMARY OF THE INVENTION

It is, therefore, an object of the present invention to provide an isolation structure for electrically isolating circuit elements formed on a strained semiconductor layer, and a method for forming the same.

To achieve the above object, an embodiment of an isolation structure according to the present invention may comprise: a substrate comprising a first semiconductor layer having a first lattice parameter, a second semiconductor layer having a second lattice parameter larger than the first lattice parameter, and a strained semiconductor layer; a well having a first conductivity type in the substrate; a plurality of isolation layers in the strained semiconductor layer and the second semiconductor layer, each isolation layer a predetermined distance apart from each other, thus defining an active region; and a plurality of punch stop layers having a second conductivity type, under the isolation layers.

The isolation layer can be through the entire second semiconductor layer, or a portion of the second semiconductor layer can remain under the isolation layer. In addition, the punch stop layer may be in the first and second semiconductor layers under the isolation layer.

In addition, a method for forming an isolation structure of a semiconductor device may comprise the steps of: forming on a first semiconductor layer having a first lattice parameter a second semiconductor layer having a second lattice parameter larger than the first lattice parameter; forming a strained semiconductor layer on the second semiconductor layer; implanting an impurity having a first conductivity type in the first semiconductor layer, the second semiconductor layer, and the strained semiconductor layer, thus forming a well; forming a plurality of trenches by etching the strained semiconductor layer and the second semiconductor layer, each trench a predetermined distance apart from each other; implanting an impurity having a second conductivity type in the exposed trenches to form a plurality of punch stop layers; and filling the trenches with an insulating material to form a plurality of isolation layers.

These and other aspects of the invention will become evident by reference to the following description of the invention, often referring to the accompanying drawings.

DETAILED DESCRIPTION OF THE INVENTION

Figure 1:
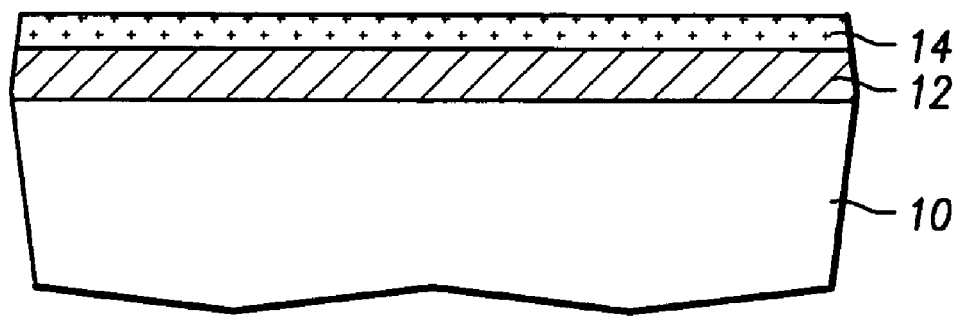
FIGS. 1 and 2 are cross-sectional view illustrating a method for forming an isolation structure in a strained semiconductor substrate according to the conventional art.
Figure 2:
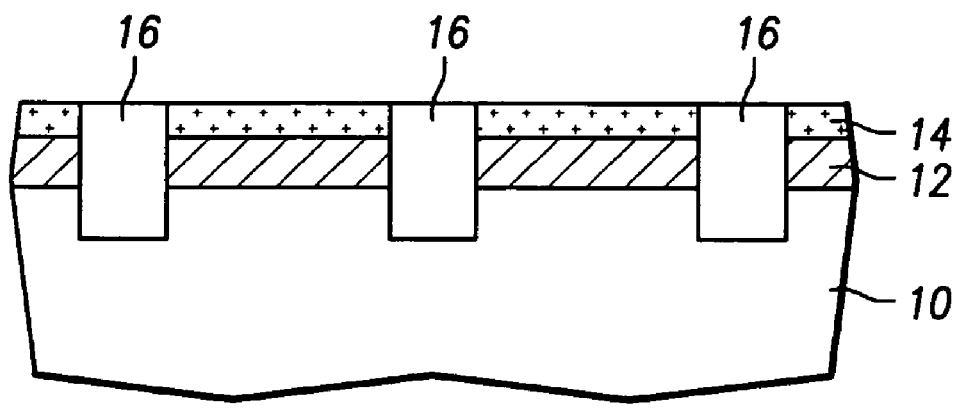
Figure 3:
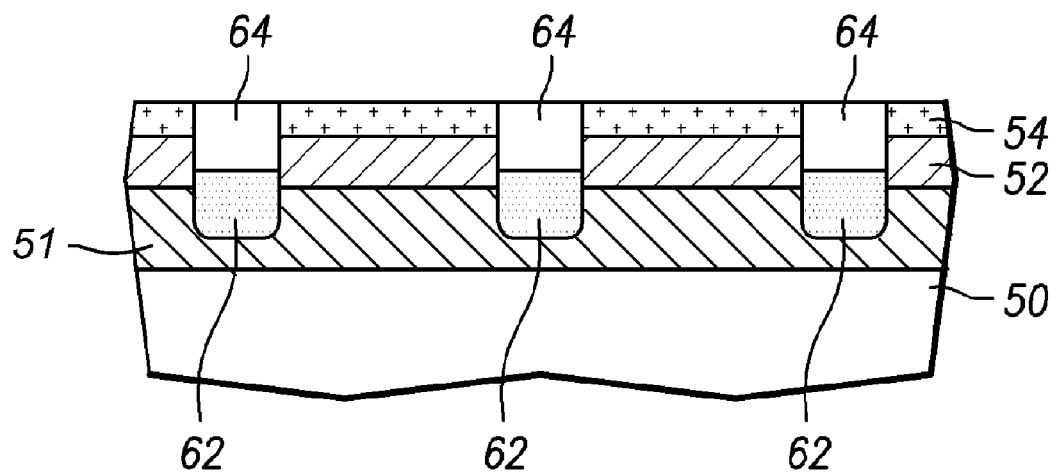
FIG. 3 is a cross-sectional view illustrating an isolation structure according to a preferred embodiment of the present invention.

FIG. 3 is a cross-sectional view illustrating an isolation structure according to a preferred embodiment of the present invention.

Referring to FIG. 3, an isolation structure according to the present invention is formed in a semiconductor substrate comprising a first semiconductor layer 50, a second semiconductor layer 52 formed on the first semiconductor layer 50, and a strained semiconductor layer 54 formed on the second semiconductor layer 52.

The first semiconductor layer 50 may comprise a silicon substrate having a first lattice parameter (e.g., a first average interatomic distance), and the second semiconductor layer 52 can comprise a layer (e.g., an epitaxial germanium layer) having a second lattice parameter (e.g., a second average interatomic distance) larger than the silicon lattice parameter. In the case where one or both of the first semiconductor layer 50 and the second semiconductor layer 52 comprise more than one atom (e.g., SiGe or GaAs), there may be more than one average interatomic distance between atoms in the layer. As long as at least one of the second lattice parameters is larger than at least one of the first lattice parameters, the second semiconductor layer may induce some strain in a subsequently deposited material that includes at least one element from the first semiconductor layer 50. The strained semiconductor layer 54 can be formed by epitaxial growth of a silicon material on the germanium layer. Alternatively, the strained semiconductor layer 54 can comprise a silicon-germanium epitaxial layer, wherein a concentration ratio of silicon to germanium may gradually increase as a function of the thickness of the layer, toward a top portion (or surface) thereof. In addition, the substrate can further comprise a buffer semiconductor layer between the second semiconductor layer 52 and the strained semiconductor layer 54, where the buffer semiconductor layer may comprise a silicon-germanium epitaxial layer (in which case, the second semiconductor layer 52 may comprise an epitaxial silicon layer). Likewise, in the buffer semiconductor layer (e.g., comprising a silicon-germanium epitaxial layer), a concentration ratio of silicon to germanium preferably increases gradually toward a top portion (or surface) thereof. When a silicon epitaxial layer 54 and/or a silicon-germanium buffer epitaxial layer are formed on the germanium semiconductor layer 52 of a relatively large lattice parameter, the lattice parameters of the silicon and silicon-germanium epitaxial layer can be increased to form the strained semiconductor layer.

Next, an n-well and/or p-well 51 are formed in the substrate comprising the first semiconductor layer 50, the second semiconductor layer 52, and the strained semiconductor layer 54. Here, the n-well or p-well 51 can be formed by a conventional ion-implantation process.

Subsequently, isolation layers 64 are formed in the strained semiconductor layer 54 and the second semiconductor layer 52 to define active regions. A portion of the second semiconductor layer 52 may remain below the isolation layer 64, as shown in FIG. 3, or the isolation layer 64 can penetrate through the entire semiconductor layer 52 to be in contact with the first semiconductor layer 50. In addition, punch stop layers 62 are formed in the first semiconductor layer 50 and (when a portion of the second semiconductor layer 52 remains below the trench in which isolation layer 64 is formed) the second semiconductor layer 52 under each isolation layer 64. The punch stop layer 62 has a conductivity type opposite to the n- or p-well 51. In other words, the punch stop layer in the n-well 51 is formed using p-type impurities, and the punch stop layer in the p-well 51 is formed using n-type impurities. For example, the punch stop layer in the n-well is doped with boron (B), gallium (Ga), or indium (In), and the punch stop layer in the p-well is doped with phosphorus (P), or arsenic (As).

The above-described isolation structure according to the present invention comprises punch stop layers 62 under isolation layers 64 so that isolation layers 64 can be formed shallower than that of a conventional approach. Therefore, in the case where the present invention is applied to a highly integrated semiconductor device, an aspect ratio of a trench in which an isolation layer is formed can be conspicuously and/or significantly reduced.

Figure 4:
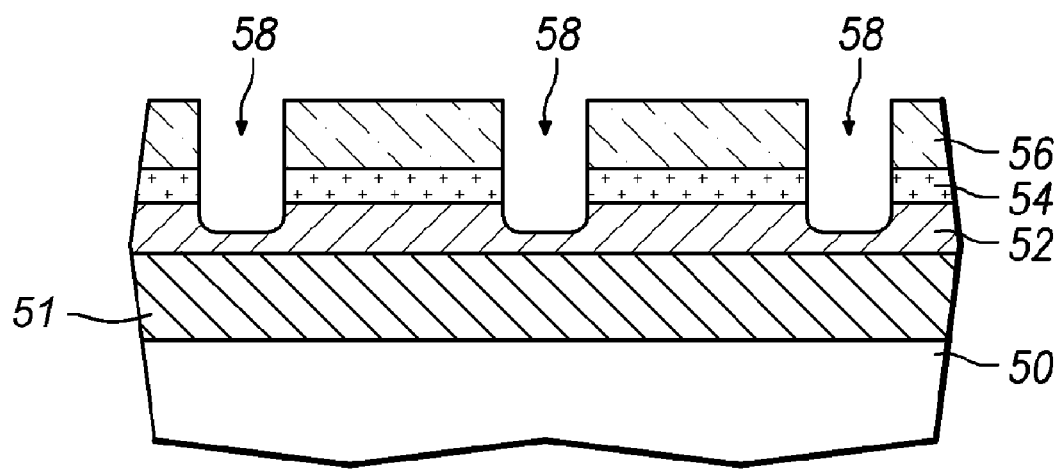
FIGS. 4 to 6 are cross-sectional views illustrating a method forming an isolation structure of a semiconductor device, according to a preferred embodiment of the present invention.
Figure 5:
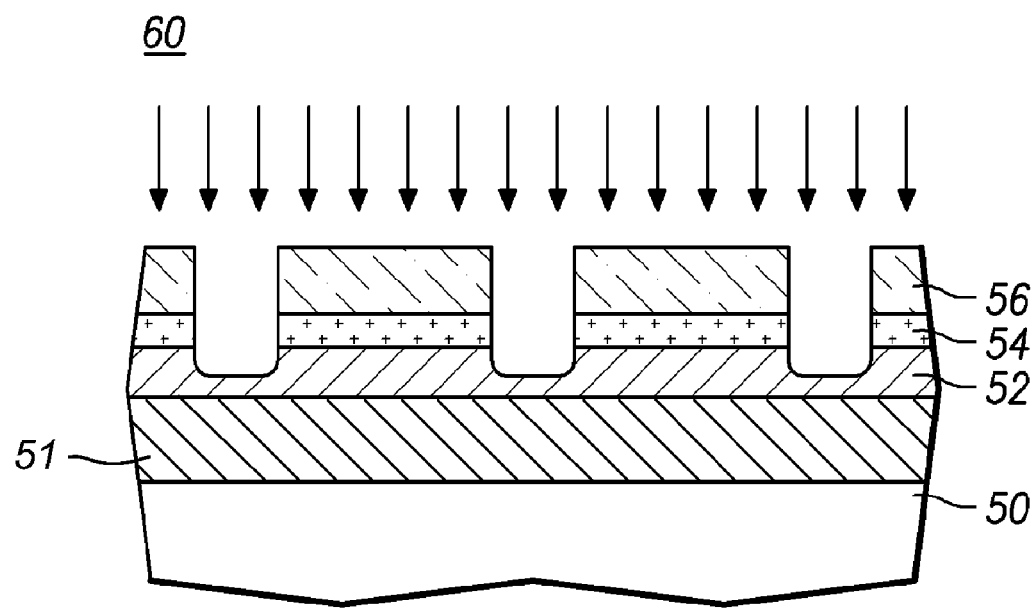
Figure 6:
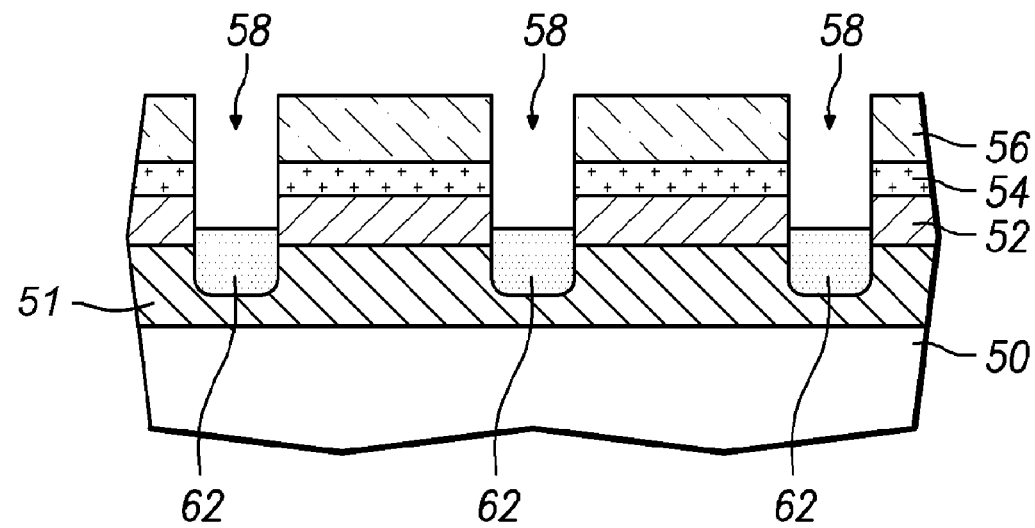

FIGS. 4 to 6 are cross-sectional views illustrating a method forming an isolation structure able to be applied to a strained channel transistor, according to a preferred embodiment of the present invention.

Referring to FIG. 4, a second semiconductor layer 52 having a second lattice parameter is formed on a first semiconductor layer 50 having a first lattice parameter. The second lattice parameter is larger than the first lattice parameter. For example, the first semiconductor layer 50 may comprise a silicon substrate as a typical semiconductor substrate, and the second semiconductor layer 52 may comprise a germanium material having a lattice parameter larger than a silicon material. A strained semiconductor layer 54 is formed on the second semiconductor layer 52, wherein the strained semiconductor layer 54 can a material having comprise one or more of the same elements (or lattice parameters) as the first semiconductor layer 50 (or the first lattice parameter). For example, the strained semiconductor layer 54 can be formed by an epitaxial growth of silicon on a germanium layer. Here, a buffer layer can be grown of the germanium layer 52 before growing the silicon layer 54, wherein a concentration ratio of silicon to germanium may increase gradually toward a top portion (or a top surface) thereof. Preferably, the strained layer has a thickness suitable to form a channel therein.

An n-well or p-well 51 is formed in the substrate comprising the first semiconductor layer 50, the second semiconductor layer 52, and the strained semiconductor layer 54, using a typical well formation process. Then, the strained semiconductor layer 54 and the second semiconductor layer 52 are etched (the strained semiconductor layer 54 is generally completely etched, and the second semiconductor layer 52 may partially or completely etched), thus forming trenches 58 (see FIG. 6). Referring back to FIG. 5, a mask 56 having openings for trenches may be formed on the strained semiconductor layer 54, and then the strained semiconductor layer 54 and the second semiconductor layer 52 are etched using the mask 56 as an etching mask, thus forming trenches 58. The trenches 58 can be also formed to expose the first semiconductor layer 50. Desirably, the trenches 58 have a depth less than the combined thicknesses of the strained semiconductor layer 54 and the second semiconductor layer 52, to retain a portion of the second semiconductor layer 52 under the trench 58. As a result, an aspect ratio of the trench can be reduced, as compared with a conventional process.

Referring to FIG. 5, impurities 60 are implanted in the exposed substrate (e.g., in the trenches) using the mask 56 as an implantation mask. Here, p-type impurities are implanted in the region where an n-well 51 is formed, and n-type impurities are implanted in the region where a p-well 51 is formed. Since the mask 56 is also used as an implantation mask, the impurities are implanted under the trenches 58.

Referring to FIG. 6, the implanted impurities under the trenches 58 form punch stop layers 62. The punch stop layers 62 may be formed in the first and second semiconductor layers 50 and 52 (and in only the first semiconductor layer 50 when the second semiconductor layer 52 is completely etched during trench formation). The n-well region 51 comprises a p-type punch stop layer, and the p-well region 51 comprises an n-type punch stop layer. For example, p-type impurities, such as boron (B), gallium (Ga), indium (In), etc., are implanted for punch stop layers in the n-well region, and n-type impurities, such as phosphorus (P), arsenic (As), etc., are implanted for punch stop layers in the p-well region.

In addition, in the case where a portion of the second semiconductor layer 52 remains under the trench 58, the punch stop layer 62 will be formed in the first and second semiconductor layers 50 and 52. Otherwise, the punch stop layers 62 will be formed only in the first semiconductor layer 50.

Subsequently, the trenches 58 are filled with an insulating material using a typical trench isolation process, thus forming isolation layers 64, as shown in FIG. 3.

According to the present invention, an isolation structure comprises an isolation layer for electrically insulating circuit elements formed in a strained semiconductor layer, and a punch stop layer for preventing a current leakage, a punch through phenomenon, and break-down of circuit elements.

In a conventional approach, the trench has a greater depth than the present invention, to electrically isolate circuit elements. In general, a deep trench has a relatively high aspect ratio, which may result in a higher incidence of gap-fill failures and voids in the insulating layer subsequently deposited in the trench. As a result, characteristics and reliability of devices may deteriorate. However, according to the present invention, an isolation structure comprises a relatively shallower trench that nonetheless can reduce or prevent deterioration of characteristics and reliability of devices, because a punch stop layer can be formed under the trench isolation layer.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming an isolation structure, comprising the steps of:
    forming, on a first semiconductor layer having a first lattice parameter, a second semiconductor layer having a second lattice parameter larger than the first lattice parameter;
    forming a strained semiconductor layer on the second semiconductor layer;
    implanting a first impurity having a first conductivity type in the first semiconductor layer, the second semiconductor layer, and the strained semiconductor layer, thus forming a well;
    forming a mask on the strained semiconductor layer, the mask having a plurality of openings;
    forming a plurality of trenches having a depth less than a combined thickness of the strained semiconductor layer and the second semiconductor layer by etching the strained semiconductor layer and partially etching the second semiconductor layer using the mask as an etching mask, each trench a predetermined distance apart from each other;
    implanting a second impurity having a second conductivity type in the first and second semiconductor layers under the exposed trenches using the mask as an implantation mask to subsequently form a plurality of punch stop layers having uppermost portions contacting lowermost portions of the trenches; and
    filling the trenches with an insulating material to form a plurality of isolation layers.

2. The method of claim 1, wherein forming the strained semiconductor layer comprises epitaxially growing a first element having a third lattice parameter smaller than the second lattice parameter.

3. The method of claim 2, wherein the third lattice parameter is strained by the second semiconductor layer.

4. The method of claim 1, wherein forming the strained semiconductor layer comprises epitaxially growing a first element having a third lattice parameter smaller than the second lattice parameter, and a second element constituting an element of the second semiconductor layer.

5. The method of claim 4, wherein a concentration ratio of the first element to the second element increases in relation to a thickness of the strained semiconductor layer toward a top surface of the strained semiconductor layer.

6. The method of claim 1, further comprising forming a buffer semiconductor layer on the second semiconductor layer before the step of forming the strained semiconductor layer, wherein forming the buffer semiconductor layer comprises epitaxial growth of the first element and a second element constituting an element of the second semiconductor layer.

7. The method of claim 6, wherein a concentration ratio of the first element to the second element increases in relation to a thickness of the strained semiconductor layer toward a top surface of the buffer semiconductor layer.

8. The method of claim 1, wherein the first semiconductor layer comprises Si.

9. The method of claim 1, wherein the second semiconductor layer comprises Ge, SiGe or GaAs.

10. The method of claim 1, wherein the strained semiconductor layer comprises an epitaxial silicon layer.

11. The method of claim 8, wherein forming the strained semiconductor layer comprises growing a silicon epitaxial layer on the second semiconductor layer.

12. The method of claim 11, wherein the strained semiconductor layer has a thickness sufficient to form a channel therein.

13. The method of claim 1, wherein forming the strained semiconductor layer comprises growing a silicon-germanium epitaxial layer on the second semiconductor layer.

14. The method of claim 13, wherein the strained semiconductor layer has a thickness sufficient to form a channel therein.

15. The method of claim 1, wherein the strained semiconductor layer has a thickness sufficient to form a channel therein.

16. The method of claim 1, wherein the second semiconductor layer comprises Ge.

17. The method of claim 16, wherein the second semiconductor layer comprises an epitaxial silicon layer.

18. The method of claim 17, wherein forming the strained semiconductor layer comprises growing a silicon-germanium epitaxial layer on the second semiconductor layer.

19. The method of claim 1, wherein the second semiconductor layer comprises SiGe.

20. The method of claim 19, wherein the second semiconductor layer comprises an epitaxial silicon layer.

* * * * *